Figure 1:
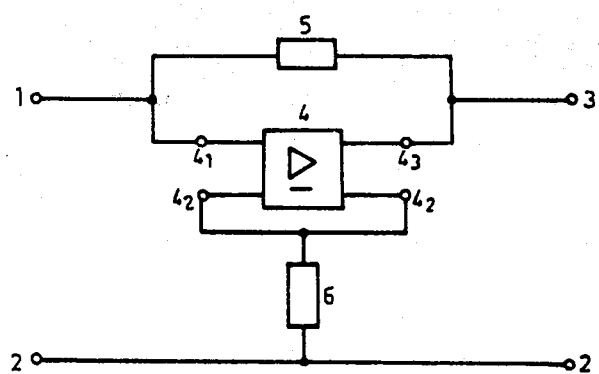

United States Patent [19]
Minot

[11] 3,938,057
[45] Feb. 10, 1976

[54] TELECOMMUNICATIONS SIGNAL AMPLIFIER

[75] Inventor: Pierre Jean Marie Minot, Ivry-sur-Seine, France

[73] Assignee: Societe Anonyme de Telecommunications, Paris, France

[22] Filed: Mar. 26, 1973

[21] Appl. No.: 345,010

[30] Foreign Application Priority Data
Aug. 4, 1972 France .............................. 72.28336

[52] U.S. Cl. .................... 330/78; 330/102; 330/107
[51] Int. Cl.² ............................................... H03F 1/34
[58] Field of Search ......... 330/78, 28, 88, 102, 105, 330/107

[56] References Cited
UNITED STATES PATENTS

| | | | |
|---|---|---|---|
| 2,315,040 | 3/1943 | Bode................................... | 330/107 |
| 2,691,078 | 10/1954 | Gluyas................................ | 330/78 |

Primary Examiner—Alfred E. Smith
Assistant Examiner—Richard A. Rosenberger
Attorney, Agent, or Firm—Jerome P. Bloom

[57] ABSTRACT

A telecommunications signal amplifier comprising an active tripole the transfer function of which has a negative real portion, the input impedance and the output impedance of which are substantially equal to one another and to the iterative impedance of the line in which the amplifier according to the invention is inserted, a first dipole of defined structure, a second dipole of structure reciprocal to the first with respect to the iterative impedance of the circuit in which the amplifier according to the invention is inserted, characterised in that said signal amplifier is reduced to a tripole by merging an input terminal and an output terminal, the other input terminal is connected to a terminal of said first dipole and to an input terminal of said tripole, the other output terminal is connected to the other terminal of said first dipole and to an output terminal of said tripole, the common input and output terminal of this tripole being joined, by means of said second dipole, to the common input and output terminal of the telecommunications signal amplifier.

1 Claim, 6 Drawing Figures

TELECOMMUNICATIONS SIGNAL AMPLIFIER

The present invention relates to a telecommunications signal amplifier. This amplifier is capable of giving, in a wide frequency band, a small noise factor, good input and output adaptation with respect to the iterative impedance of the line in which it is inserted. Its gain, moreover, can vary as a function of the frequency, according to the pre-established law. These characteristics make it possible to use this amplifier in particular as an intermediate line amplifier of a cable transmission system with currents carrying several dozen communication channels.

The characteristics of the telecommunications signal amplifier, according to the invention, are the result of its particular structure and the specific relations established between the components which constitute it. These components are reduced to two dipoles and an active tripole.

The most general equivalent idea that can be given of this active tripole is that of an active quadripole reduced to a tripole by merging an input and output terminal, comprising between its input terminals an impedance, equal to the input impedance of the tripole and, between its output terminals, an electromotive force in series with an impedance, equal to the output impedance of the tripole. The electromotive force is defined as proportional to the input voltage of the tripole, the proportionality coefficient being a compound number. The use of this simplified concept of equivalene enables the structure of this amplifier according to the invention to be understood as a T bridge network of which three branchs are passive and the fourth is active.

The telecommunications signal amplifier according to the invention comprises an active tripole of which the transfer function, a compound number representing the relationship between the output voltage and the input voltage has a negative real portion, of which the input impedance and the output impedance are substantially equal to one another and to the iterative impedance of the line in which the amplifier, according to the invention, is inserted, a first passive dipole of a defined structure, a second passive dipole which is reciprocal to the first with respect to the iterative impedance of the line in which the amplifier according to the invention is inserted, and is characterised in that, the signal amplifier, is reduced to a tripole by merging an imput terminal and an output terminal, the other input terminal is connected to a terminal of said first dipole and an input terminal of said tripole, the other output terminal is connected to the other terminal of said first dipole and to an output terminal of said tripole, the common input and output of this tripole being joined, by means of the said second dipole, to the common input and output terminal of the telecommunications signal amplifier.

The invention is illustrated by way of non-limitative example on the adjoining drawings in which:

FIG. 1 shows the wiring diagram of the amplifier according to the invention, of which the components are assembled in functional units.

Figure 2:
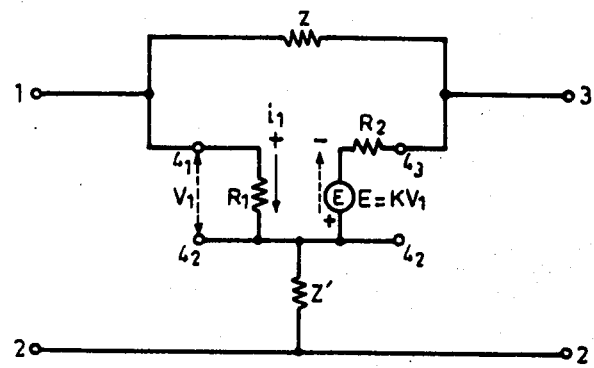

FIG. 2 and its annexes 2a, 2b, 2c make it possible, by the consideration of the equivalent electrical diagram of a tripole, to understand its characteristics and to establish the relationships that exist between the components of the assembly.

Figure 3:
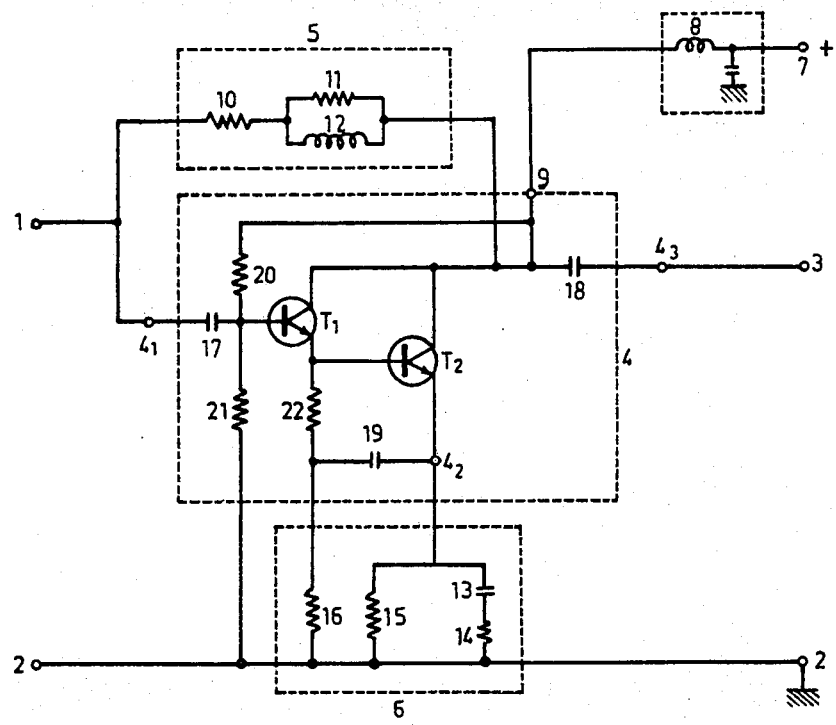

FIG. 3 relates to a particular embodiment of the amplifier according to the invention given by way of example in the case where the active tripole comprises two transistors.

Figure 4:
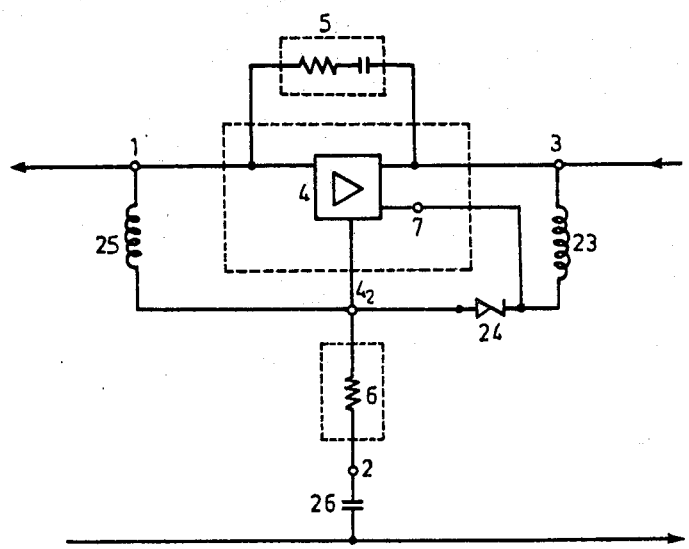

FIG. 4 represents the case of an amplifier, according to the invention, supplied with a constant current from a distance by means of a line in which the amplifier is inserted.

According to FIG. 1, the amplifier according to the invention has input terminals 1-2 and output terminals 3-2, the terminal 2 being common to the input and to the output.

The input terminal 1 is connected to an input terminal $4_1$, the output terminal 3 to an output terminal $4_3$ of the tripole 4, of which the terminal $4_2$ is common to the input and to the output. This tripole has, from input to output, a transfer function of which the real portion is negative.

The first dipole 5, is connected to the terminals 1 and 3 of the amplifier according to the invention. The second dipole 6 is connected to the terminal $4_2$ of the tripole and to the terminal 2 of the amplifier according to the invention.

The impedance values of the dipoles 5 and 6, designated respectively by Z and Z', are linked to one another by a reciprocal relationship.

$$Z\,Z' = R_o^2$$

where Ro is the iterative impedance of the line connected, on one hand, to the terminals 1-2, and, on the other, to the terminals 3-2 of the amplifier according to the invention.

Moreover, the input impedance and the output impedance of the tripole are each close to Ro.

A study of the characteristics of the amplifier according to the invention can be made from the simplified equivalent diagram, in FIG. 2, of the assembly in FIG. 1.

As regards the active tripole 4, its input impedance R1 and its output impedance R2 are theoretically equal to one another and to the iterative impedance Ro of the connected line, before the terminals 1-2, and after the terminals 3-2, of the amplifier according to the invention. In addition, according to the sign convention adopted for the current $i_1$ which has flowed through the impedance $R_1$, the sign convention of the equivalent electromotive force at the output of the amplifier as such is the one representative. It is taken, in the effective pass band of the tripole, this electromotive force is proportional to the potential difference $V_1 = R_1\,i_1$ between the input terminals $4_1$ and $4_2$.

$$E = K\,V_1$$

Relatively to the impedances of the dipoles 5–6, their values, respectively designated Z and Z', can be defined with respect to the iterative impedance Ro, according to the relationships:

$$Z = z\,R_o$$
$$zZ' = R_o$$

The small value z of the impedance Z varies with the frequency.

Figure 2A:
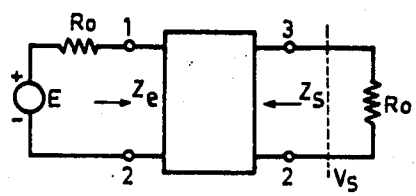

When the insertion is made under the conditions shown in FIG. 2a, it is possible to calculate the value of the input impedance Ze and of the output impedance Zs, as well as the value of the transfer function, G, of the amplifier according to the invention:

$$G = -\frac{2\,V_s}{E}$$

The calculation shows that under the nominal conditions where each of the impedances R1 and R2 of the tripole is equal to Ro, the impedances Ze and Zs are exactly equal to Ro. It also shows that the amplifier according to the invention has a transfer function such that the following relation is:

$$\frac{1}{z} = \frac{1}{1+G} - \frac{1}{1+\frac{K}{2}}$$

In practice it is found that when K is large there remains: $G \sim z - 1$

When R1 differs from Ro by a given quantity, $\Delta$, the impedance Ze differs from Ro by a quantity $\delta$, equal to the product of $\Delta$ in accordance with the relationship:

$$\frac{2G}{K}$$

The same applies to Zs when R2 differs from Ro. The amplifier according to the invention thus has very good characteristics as regards the adaptation of impedances to the circuit in which it is inserted. By the appropriate choice of the small impedance z, thus of the structure of the first dipole, it is possible to give the transfer function the absolute value which varies with the frequency within the entire pass band, that current price requires.

Lastly, it should be stated that it is possible to include in Z', and to compensate for them in Z, the electrical equivalents, the self-inductance in particular, of the interference connections which the wiring requires. On account of this fact, the tripole can be considered as being theoretically perfect. The amplifier according to the invention has characteristics which make it suitable for the amplification of wide frequency bands.

Figure 2B:
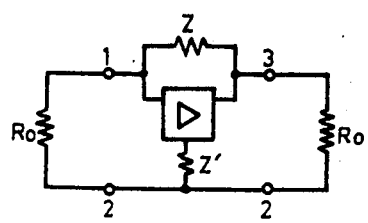
Figure 2C:
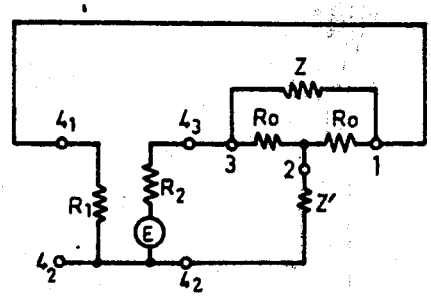

A consideration of the assembly, designed in another way, as is shown in FIG. 2c, easily leads to the conditions which ensure the stability of the amplifier according to the invention. These conditions can be derived from the following expression, which is an open loop transfer function:

$$\frac{1}{z+1} \cdot \frac{K}{2}$$

The noise factor of the amplifier according to the invention cannot be less than that of the isolated tripole of the assembly.

Referring to the assembly, represented in FIG. 2b, it can be shown that the impedances Z and Z' also contribute toward increasing the noise power. However, the increase of a noise factor which results from it is of the order of:

$$\frac{1}{2} \frac{1}{z} \frac{(G+1)^2}{G^2}$$

and, if K is sufficiently large, there remains an increase, normally negligible, equal to:

$$\frac{G+1}{2G^2}$$

of the noise factor due to the tripole.

FIG. 3 shows one embodiment of the amplifier according to the invention. It is supplied, between the ground, connected to the terminal 2 and the positive pole 7 of a battery, by means of an effective decoupling unit 8, connected to 7 and to the supply terminal 9 of the active tripole.

The impedance Z is that of the network 5, constituted by the two resistors 10, 11 and a self-inductance 12 in parallel with 11. The impedance Z' is that of the network 6 where the capacitor 13 to 12, the resistor 14 to 11, and the two resistors 15 and 16 in parallel, correspond to the resistor 10 of the network 5, in a reciprocal relationship.

The active tripole 4 comprises the decoupling capacitors 17 to 19 and the two transistors $T_1$, $T_2$ constituting the amplifying means. According to an assembly known in itself, the collectors of $T_1$ and $T_2$ are joined together to the supply terminal 9, the emitter of $T_1$ is joined to the base of $T_2$. The base of $T_1$ is polarised by the high value resistors 20 and 21 between the terminal 9 and the ground. The resistor 20 fixes the value of the input and output impedances of the tripole. The emitter resistor of $T_1$, 22, enables the current in $T_1$ to be adjusted, and contributes a little to the value of the input impedance of the tripole.

The given interference components: the self-inductance between the emitter of $T_1$ and the base of $T_2$, the self-inductance between the emitter $T_2$ and the terminal $4_2$, which is the ground for alternating currents, of the tripole, the capacitor between the collector and base of $T_1$, have an influence on the behaviour of the tripole. It is possible, however, by means of the structure Z', to compensate for the influence of the last mentioned of these components. In addition, it is advantageous that the components of the structure of Z' be concentrated at their relevant extremities.

The amplifir according to the invention, made as shown in FIG. 3, with suitable precautions has been designed, for a pass band going up to 60 megahertz, to show a variable gain from 5 to 13 decibels and an impedance inadaptibility, with respect to a value of Ro equal to 75 ohms, which never exceeds 5 percent, in a pass band.

The structure in FIG. 3, where no transformers are included, lends itself to the production of integrated circuits.

The transistors $T_1$ and $T_2$, in a construction with discrete components, have frequency cuts $f_1$, respectively of 1,8 GHz for $T_1$ and of 1,3 GHz for $T_2$.

The amplifier according to the invention has a structure which moreover is very advantageous in the frequent case, where the polarity of the terminal 7 in the FIG. 3 is obtained, in fact, from a constant current supply provided by the telecommunications circuit itself.

In such a case, FIG. 4 represents the principle of the arrangement that should be adopted. The current supplied from a distance flows through the inductances 23 and 25, as well as through a Zener 24. This circuit is connected, as shown, to the terminals 3, 1 and $4_2$ of the amplifier according to the invention. Moreover, a high tension capacitor 26 is connected between the terminal 2 of the amplifier according to the invention and the return wire of the current supplied from a distance. A terminal of the Zener diode 24 is connected to the supply terminal 7 of the amplifier.

In some cases of embodiment of the device according to the invention for high frequencies the capacitor 26 is advantageously replaced by one or a plurality of capacitors which, if necessary, can be integrated in the impedance 6.

This arrangement greatly facilitates the construction of a switching filter, since the inductances 23 and 25 and the capacitor 26 cannot be compared, because of their values, with th analagous components of the commonly used switching filters.

Of course, the invention is not limited to the examples of its embodiment herein above described and illustrated, and on the basis of which other methods and other forms of embodiment can be envisaged, without departing from the scope of the invention.

What is claimed is:

1. A telecommunications signal amplifier presenting an input terminal, an output terminal, and a common input and output terminal and being composed:

of an active tripole provided with an input terminal, an output terminal and a common input and output terminal and a first passive dipole including two terminals, one of which is connected to the common input and output terminal of the tripole, and the other of which is connected to the common input and output terminal of the amplifier; and a second passive dipole including two terminals, one of which is connected to said input terminal of said amplifier and said input terminal of said active tripole and the other of which is connected to said output terminal of said amplifier and said output terminal of said active tripole;

said amplifier being characterized in that the active tripole presents a transfer function with a negative real portion and the active tripole also exhibits an input impedance and an output impedance which are approximately equal to one another and to the iterative impedance of the line in which said amplifier is inserted, in that said first passive dipole presents a complex impedance, and in that the impedance of the second dipole is the reciprocal of the impedance of the first dipole with respect to the iterative impedance of the line into which the amplifier is inserted.

* * * * *

UNITED STATES PATENT AND TRADEMARK OFFICE
CERTIFICATE OF CORRECTION

PATENT NO. : 3,938,057

DATED : February 10, 1976

INVENTOR(S) : Pierre Jean Marie Minot

It is certified that error appears in the above-identified patent and that said Letters Patent are hereby corrected as shown below:

Col. 1, line 14, -- thousand -- is inserted following "dozen";

line 32, "lene" is corrected to read -- lence --;

line 34, "branchs" is corrected to read -- branches --;

Col. 3, line 9, the letter "z" is indistinct;

line 27, -- to -- is inserted following "give".

Col. 4, line 43, "amplifir" is corrected to read -- amplifier --.

Col. 5, line 14, "th" is corrected to read -- the --.

Signed and Sealed this

Twenty-seventh Day of July 1976

[SEAL]

Attest:

RUTH C. MASON
*Attesting Officer*

C. MARSHALL DANN
*Commissioner of Patents and Trademarks*